US 009595645B2

United States Patent
Tong et al.

(10) Patent No.: US 9,595,645 B2
(45) Date of Patent: *Mar. 14, 2017

(54) LED LENS DESIGN WITH MORE UNIFORM COLOR-OVER-ANGLE EMISSION

(71) Applicant: Bridgelux, Inc., Livermore, CA (US)

(72) Inventors: Tao Tong, Fremont, CA (US); Wenhui Zhang, Pleasanton, CA (US); R. Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/045,095

(22) Filed: Feb. 16, 2016

(65) Prior Publication Data

US 2016/0172551 A1    Jun. 16, 2016

Related U.S. Application Data

(63) Continuation of application No. 14/717,977, filed on May 20, 2015, now Pat. No. 9,276,177, which is a continuation of application No. 13/866,562, filed on Apr. 19, 2013, now Pat. No. 9,065,024.

(60) Provisional application No. 61/641,219, filed on May 1, 2012.

(51) Int. Cl.

| | |
|---|---|
| *H01L 33/50* | (2010.01) |
| *H01L 25/075* | (2006.01) |
| *H01L 33/54* | (2010.01) |
| *H01L 33/60* | (2010.01) |
| *H01L 33/62* | (2010.01) |

(52) U.S. Cl.
CPC ........ *H01L 33/507* (2013.01); *H01L 25/0753* (2013.01); *H01L 33/50* (2013.01); *H01L 33/505* (2013.01); *H01L 33/54* (2013.01); *H01L 33/60* (2013.01); *H01L 33/62* (2013.01); *H01L 2924/0002* (2013.01); *H01L 2933/0041* (2013.01); *H01L 2933/0058* (2013.01); *H01L 2933/0066* (2013.01)

(58) Field of Classification Search
CPC ......... H01L 33/54; H01L 33/56; H01L 33/60; H01L 33/505; H01L 33/502
See application file for complete search history.

(56) References Cited

U.S. PATENT DOCUMENTS

| | | | |
|---|---|---|---|
| 7,312,560 B2 | 12/2007 | Ouderkirk et al. | 313/113 |
| 7,520,641 B2 | 4/2009 | Minano et al. | 362/297 |
| 7,670,031 B2 | 3/2010 | Ogawa et al. | 362/311.02 |

(Continued)

*Primary Examiner* — John C Ingham
(74) *Attorney, Agent, or Firm* — Imperium Patent Works; Darien K. Wallace

(57) ABSTRACT

An LED device with improved angular color performance has a silicone lens shaped as a portion of a sphere. The lens is molded over an array of LED dies disposed on the upper surface of a substrate. Phosphor particles are disbursed throughout the material used to mold the lens. The distance between farthest-apart edges of the LED dies is more than half of the length that the lens extends over the surface of the substrate. The distance from the top of the lens dome to the surface of the substrate is between 57% and 73% of the radius of the sphere. Shaping the lens as the top two thirds of a hemisphere reduces the non-uniformity in the emitted color such that neither of the CIE color coordinates x or y of the color changes more than 0.004 over all emission angles relative to the surface of the substrate.

20 Claims, 9 Drawing Sheets

(56) References Cited

U.S. PATENT DOCUMENTS

| | | | |
|---|---|---|---|
| 8,253,154 B2 | 8/2012 | Jung et al. | 257/98 |
| 8,283,675 B2 * | 10/2012 | Ohta | H01L 33/505 257/13 |
| 8,475,013 B2 | 7/2013 | Takahashi et al. | 362/363 |
| 9,065,024 B2 * | 6/2015 | Tong | H01L 33/507 |
| 2011/0085352 A1 | 4/2011 | Ito et al. | 362/617 |
| 2013/0270587 A1 | 10/2013 | Ouderkirk et al. | 257/89 |

* cited by examiner

LED LENS DESIGN WITH MORE UNIFORM COLOR-OVER-ANGLE EMISSION

CROSS REFERENCE TO RELATED APPLICATIONS

This application is a continuation of, and claims priority under 35 U.S.C. §120 from, nonprovisional U.S. patent application Ser. No. 14/717,977 entitled "LED Lens Design with More Uniform Color-Over-Angle Emission," filed on May 20, 2015, now U.S. Pat. No. 9,276,177, which in turn is a continuation of, and claims priority under 35 U.S.C. §120 from, nonprovisional U.S. patent application Ser. No. 13/866,562 entitled "LED Lens Design with More Uniform Color-Over-Angle Emission," filed on Apr. 19, 2013, now U.S. Pat. No. 9,065,024. Application Ser. No. 13/866,562, in turn, claims priority under 35 U.S.C. §119 from U.S. Provisional Application No. 61/641,219, entitled "LED Lens Design with More Uniform Color-Over-Angle Emission," filed on May 1, 2012. The entire subject matter of application Ser. Nos. 14/717,977, 13/866,562 and 61/641,219 is incorporated herein by reference.

TECHNICAL FIELD

The present invention relates generally to light-emitting diodes and, more specifically, to a lens design that causes the color of the emitted light to be more uniform over the entire range of angles from which the light is emitted.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. The active layers typically include InGaN materials that emit blue light. In order to produce white light, wavelength converting materials commonly known as phosphors are used to convert part of the blue light emitted by the LED into light of longer wavelengths, such as yellow and red, so as to generate a combination of light having the desired spectral characteristics. Examples of phosphors are yttrium aluminum garnet ($Y_3Al_5O_{12}$ or YAG) and terbium aluminum garnet ($Tb_3Al_5O_{12}$ or TAG). The combination of blue and yellow light appears to the human eye as "cool white," which has a color temperature in the range of 5000-8000 degrees Kelvin, corresponding to daylight. By adding red to the blue and yellow light, "warm white" light can be generated with a color temperature in the range of 2700-3500 degrees Kelvin, which is used for indoor lighting.

FIG. 1 (prior art) shows a conventional LED device 10 in which the phosphor 11 is deposited as a layer over an LED die 12 disposed on the upper surface of a substrate 13. A silicone lens 14 is molded over LED die 12 and phosphor plate 11. Phosphor plate 11 covers only the top surface of LED die 12 and does not cover the sides. The light that is emitted from lens 14 contains different amounts of blue and yellow at different angles. For example, the light that is emitted orthogonally from the top surface of LED die 12 and out through the top of the domed lens 14 (at zero degrees) is much bluer than the light that is emitted in a ring at about seventy-five degrees from orthogonal.

FIG. 2 (prior art) is a graph of the angular color performance of LED device 10 of FIG. 1. The graph shows how the color of the light emitted from lens 14 changes over the angle of the emitted light. The colors are defined by the color coordinates x and y of the CIE XYZ color space created by the International Commission on Illumination (CIE). The dashed line 15 indicates the change in the color coordinate x (Δ ccx) over the emission angles −90° through 0° to 90°, as those angles are shown in FIG. 1. The solid line 16 indicates the change in the color coordinate y (Δ ccy) over the same range of emission angles. Solid line 16 shows that the value of the color coordinate y increases by as much as 0.044 over the range of emission angles from 0° to 75°, while the color coordinate x also increases over the same range. Thus, LED device 10 produces a bluish spot centered at 0° and a yellowish ring at about 75°. Customers of LED device 10 find the bluish spot and yellowish ring to be undesirable and would prefer a uniform white light to be emitted at all angles.

FIG. 3 shows an LED device 17 that exhibits a somewhat improved angular color performance compared to LED device 10 of FIG. 1. The phosphor in LED device 17 is disbursed throughout the silicone that forms an hemispherical lens 18. The silicone lens 18 is molded onto the upper surface of a substrate 19 and over an array of LED dies that includes die 20 and die 21. But LED device 17 also exhibits some non-uniformity in its color-over-angle light emission characteristics.

FIG. 4 is a graph showing the angular color performance of LED device 17 of FIG. 3. The graph shows how the color of the light emitted from lens 14 changes over the angle of the emitted light. The colors are indicated with the color coordinates x and y of the CIE-1931 XYZ color space. The dashed line 22 indicates how the color coordinate x (ccx) changes over the emission angles −90° through 0° to 90°, as those angles are shown in FIG. 3. The solid line 23 indicates the how the color coordinate y (ccy) changes over the emission angles −90° through 0° to 90°. FIG. 4 shows that LED device 17 produces a bluish ring at about ±55° between a yellowish spot at 0° and a yellowish ring towards ±90°. The color performance indicated in FIG. 4 applies to LED dies and phosphors that produce warm white light corresponding to about 3000° K. Where less phosphor is used to produce cool white light, such as corresponding to 5600° K, the variation in the color over the range of emission angles is even larger.

FIG. 5 shows the change in values of the color coordinates x and y indicated in FIG. 4. The change in the values of the color coordinate x over the range of emission angles is about the same as the change in the values of the color coordinate y, so dashed line 24 represents the change in each of the color coordinates x and y. The values of the color coordinates x and y increase by as much as 0.04 from about 60° to 90° and from about −50° to −90°. Although the change in color over emission angle for LED device 17 is somewhat less than for LED device 10, the bluish ring at about ±55° from LED device 17 is more noticeable than the bluish spot at 0° from LED device 10. The bluish spot at 0° is less perceptible because the color is constantly becoming more bluish as the emission angle decreases for LED device 10, whereas the color emitted by LED device 17 becomes more bluish towards the ring at about ±55° and then rapidly becomes more yellowish. The human eye is more sensitive to the change toward more blue and then less blue than to a constant change in one color direction. Customers of LED device 17 find the bluish ring to be undesirable.

An LED device is sought that emits light with a more uniform color distribution over the entire range of emission angles so that colored spots and rings are less perceptible.

SUMMARY

An LED device that exhibits improved angular color performance has a novel lens shaped as a portion of a sphere. The lens is molded over an array of LED dies disposed on the upper surface of a substrate. Phosphor particles are disbursed throughout the silicone that is used to mold the lens. The distance between farthest apart edges of the LED dies is more than half of the bottom chord length that the lens extends over the upper surface of the substrate. The distance from the top of the dome of the lens to the upper surface of the substrate is between 57% and 73% of the radius of the sphere of which the lens shape is a portion. The lens shaped as the top two thirds of a hemisphere is a means for reducing the non-uniformity in the color emitted by the LED device over all emission angles relative to the upper surface of the substrate such that neither of the CIE color coordinates x or y of the color changes more than 0.004 over all emission angles relative to the surface of the substrate. For example, light is emitted at the angles from −90° through 0° to 90°.

A layer of highly reflective material is disposed over the upper surface of the substrate and renders the upper surface of the substrate more reflective than the top surfaces of the LED dies. The highly reflective layer does not extend under the LED dies and does not extend over the LED dies, but rather contacts the edges of the LED dies. Lens material is compression molded to form the dome of the lens together with a flash layer over the upper surface of the substrate. Contact pads are disposed on the upper surface of the substrate laterally outside of the dome. The dome and the flash layer are disposed over substantially all of the upper surface of the substrate except for over the contact pads.

A method involves forming a lens over LED dies using a lens material containing disbursed phosphor particles. The LED dies are attached to the upper surface of a substrate. The lens has a dome and is shaped as a portion of a sphere. The bottom chord length of the lens is less than twice the surface emitter length between farthest apart edges of the LED dies. The height of the dome above the upper surface of the substrate is between 57% and 73% of the radius of the sphere of which the lens shape is a portion.

An LED device includes LED dies, phosphor particles and a means for reducing the non-uniformity in the color of the light emitted by the LED device over all of the emission angles. The LED dies are disposed on an upper surface of a substrate. The surface emitter length is the maximum distance between farthest apart edges of the LED dies. The phosphor particles are disbursed throughout a material that is molded over the LED dies on the upper surface of the substrate. The LED dies emit bluish light, and the phosphor particles convert some of the bluish light to yellowish light. The emitted bluish light combined with the emitted yellowish light together exhibit a color at each angle relative to the upper surface of the substrate. The means reduces the non-uniformity in the color of the emitted light such that each of the CIE color coordinates x and y of the emitted color does not change more than 0.004 over all angles relative to the upper surface. The surface emitter length is more than twice the maximum length that the means extends over the upper surface of the substrate.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 10-11 compare the internal reflectance of light emitted at various angles within the lenses.

DETAILED DESCRIPTION

Reference will now be made in detail to some embodiments of the invention, examples of which are illustrated in the accompanying drawings.

Figure 6:
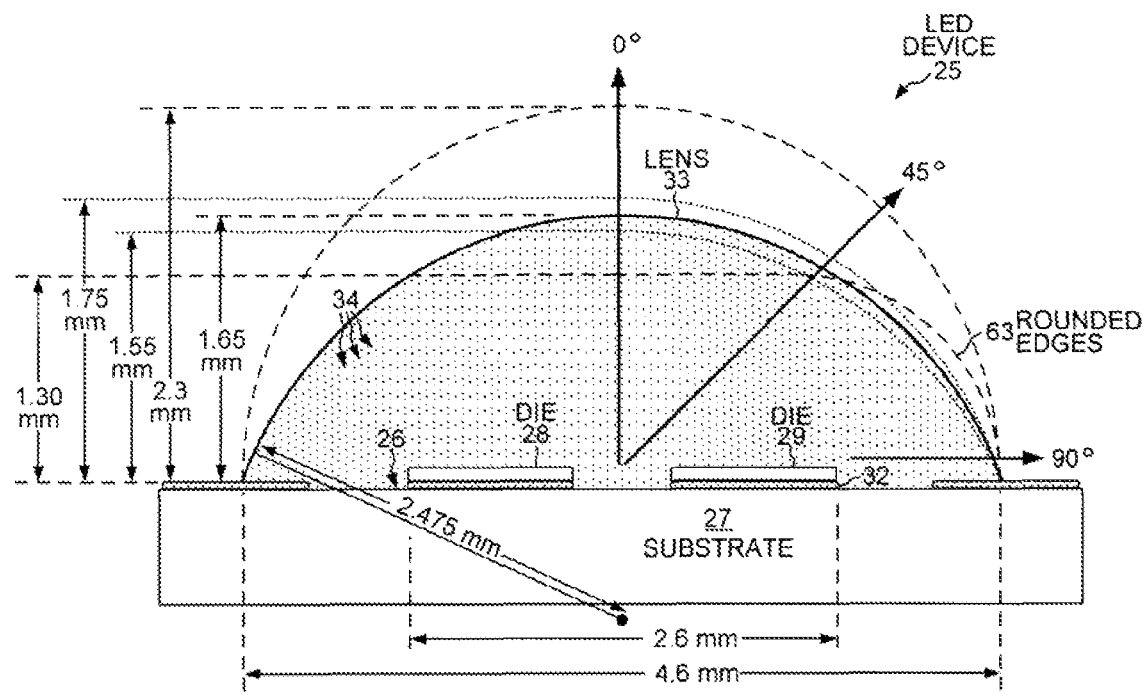
FIG. 6 is a cross-sectional view of a novel LED device having a lens that is a portion of a sphere and that emits light with a more uniform color over the entire range of emission angles.

FIG. 6 is a cross-sectional view of a novel LED device 25 that emits light with a more uniform color over the entire range of emission angles. LED device 25 includes an array of light emitting diode (LED) dies disposed on the upper surface 26 of a substrate 27. For example, LED device 25 includes a two-by-two array of LED dies, including LED dies 28-31. Thermal interface materials 32 are disposed between the LED dies and substrate 27. For example, the thermal interface materials 32 may include a silver-filled epoxy deposited over a layer of Cu—Ni—Au alloy or Cu—Ni—Ag allow. A lens material is then overmolded over the LED dies 28-31 and forms the shape of a lens 33. For example, the lens material is a clear resin encapsulant, such as silicone or epoxy. The lens material is disposed on the upper surface 26 of substrate 27 and over the LED dies 28-31.

Phosphor particles 34 are disbursed evenly throughout the lens material. Bluish light is emitted from the top surfaces of the LED dies 28-31. A portion of the bluish light strikes the particles of phosphor 34 and is converted into yellowish light. Thus, the LED dies act as surface emitters, whereas the phosphor particles 34 within lens 33 act as a volume emitter. A surface emitter length extends from an edge of one of the LED dies to a farthest edge of another of the LED dies. In the orientation of the LED dies 28-31 shown in FIG. 6, the surface emitter length extends at least from one edge of LED die 28 to the farthest edge of LED die 29. In the orientation of FIG. 6, the surface emitter length is 2.6 millimeters.

Figure 7:
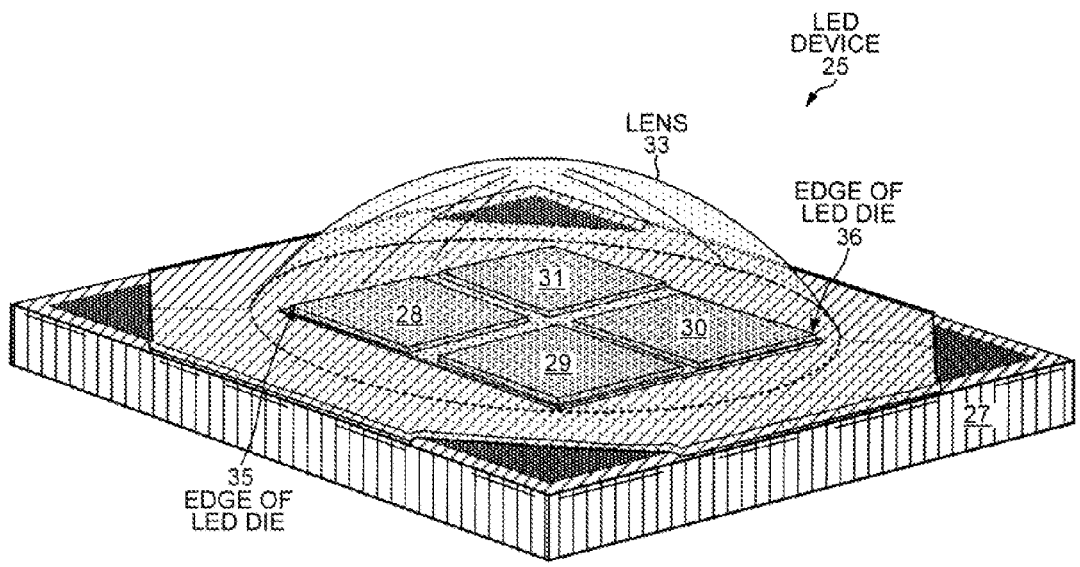
FIG. 7 is a perspective view of the LED device of FIG. 6 showing two-by-two array of LED dies.
Figure 8:
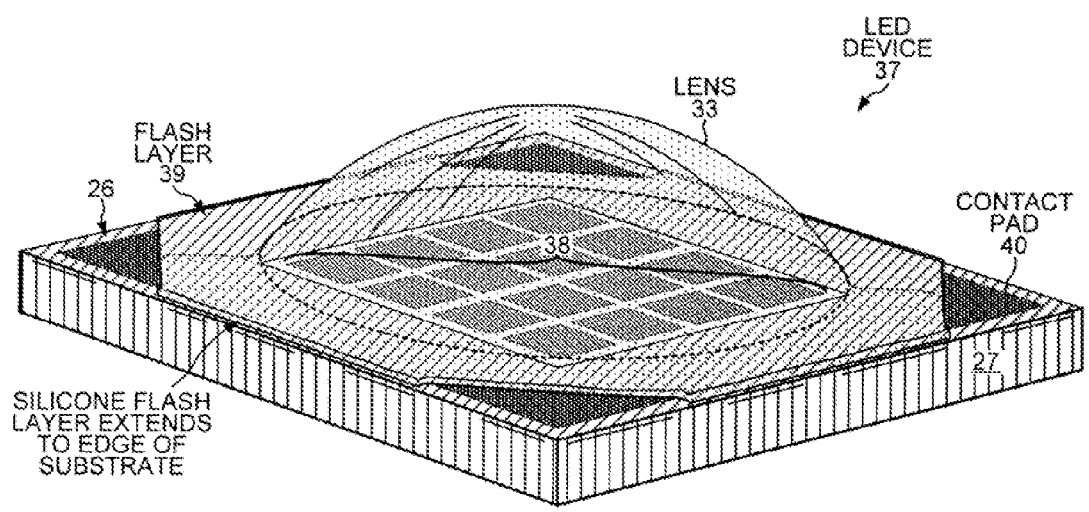
FIG. 8 is a perspective view of an LED device with a four-by-four array of LED dies and a lens that is a portion of a sphere.

FIG. 7 is a perspective view of LED device 25 that shows the two-by-two array of LED dies 28-31. In the diagonal orientation, the surface emitter length extends from the farthest point 35 on one edge of LED die 28 to the farthest point on the distal edge of LED die 30. In the orientation of FIG. 7, the surface emitter length is 3.68 millimeters. FIG. 8 shows an LED device 37 in which lens 33 is molded over a four-by-four array of LED dies. The surface emitter length 38 is the maximum distance between the farthest two edges of the sixteen LED dies. The surface emitter length in FIG. 8 is also 3.68 millimeters. FIG. 8 also shows the flash layer 39 that results when lens 33 is formed using compression molding. The lens material is compression molded to form the domed lens 33 together with flash layer 39 that covers upper surface 26 of substrate 27. After the molding step, flash layer 39 is removed from above the contact pads 40 at the corners of substrate 27. Where flash layer 39 is not removed from above the contacts pads 40, flash layer 39 extends to the edges of substrate 27. Flash layer 39 is only about fifty microns thick.

Figure 9:
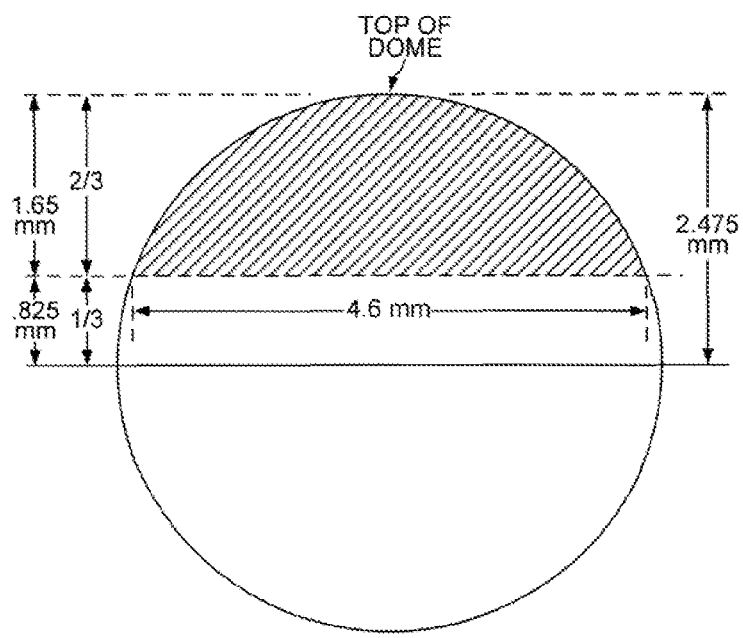
FIG. 9 shows a cross section of the top two-thirds by height of the top half of a sphere with dimensions corresponding to the lens of the LED device of FIG. 6.

The lens material is shaped as a portion of a sphere. Lens 33 is the top two-thirds of a hemisphere by height. In the embodiment of FIG. 6, the dome height is 1.65 mm and extends from the top of the dome to the upper surface 26 of substrate 27. FIG. 9 illustrates a cross section of the top two-thirds by height of the top half of a sphere with a radius of 2.475 mm. The radius of the surface of lens 33 in FIG. 6 is 2.475 mm. Thus, the dome height is between 57% and 73% of the radius. The bottom chord length of lens 33 over the upper surface 26 of substrate 27 is the maximum length that the lens material extends over the upper surface 26. In the embodiment of FIG. 6, the bottom chord length is 4.6 mm and is, therefore, less than twice the surface emitter length.

Figure 1:
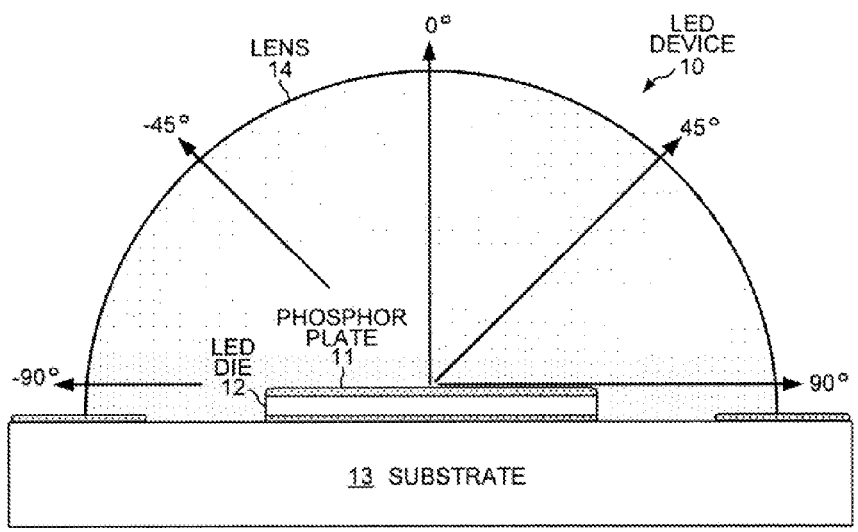
FIG. 1 (prior art) is a cross-sectional view of a conventional LED device in which phosphor is deposited as a layer over an LED die on the upper surface of a substrate.
Figure 2:
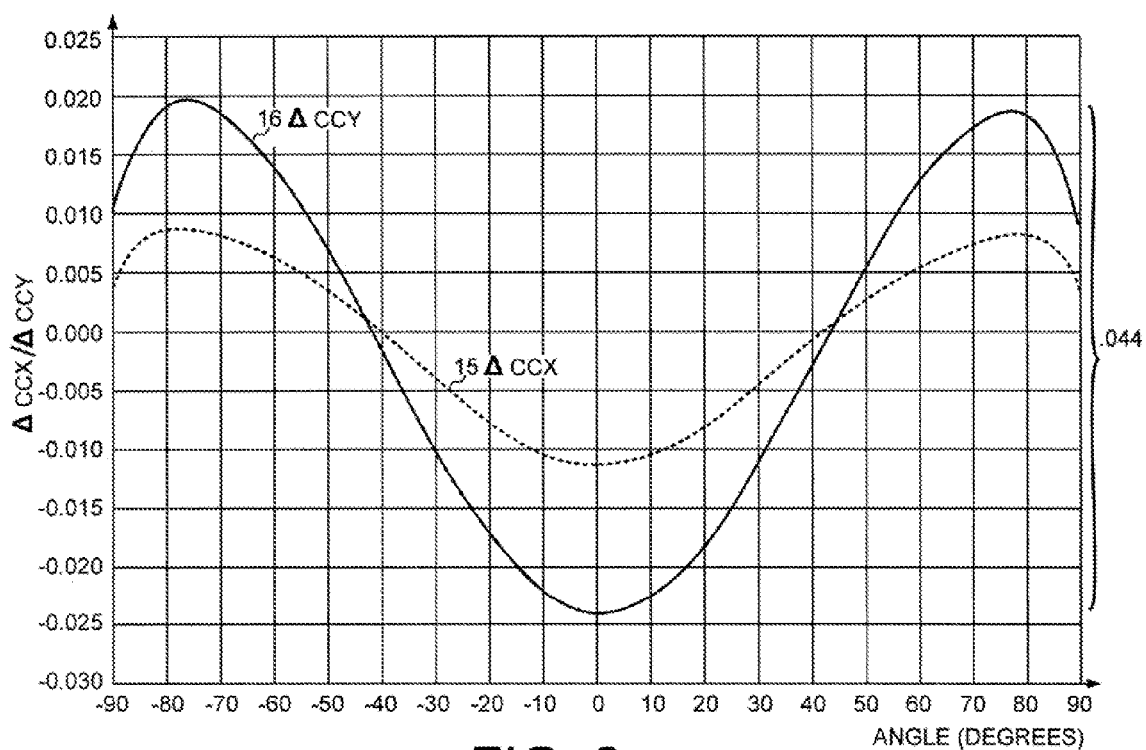
FIG. 2 (prior art) is a graph of the change in the color coordinates x and y over the emission angles −90° through 0° to 90° for the light emitted by the LED device of FIG. 1.
Figure 3:
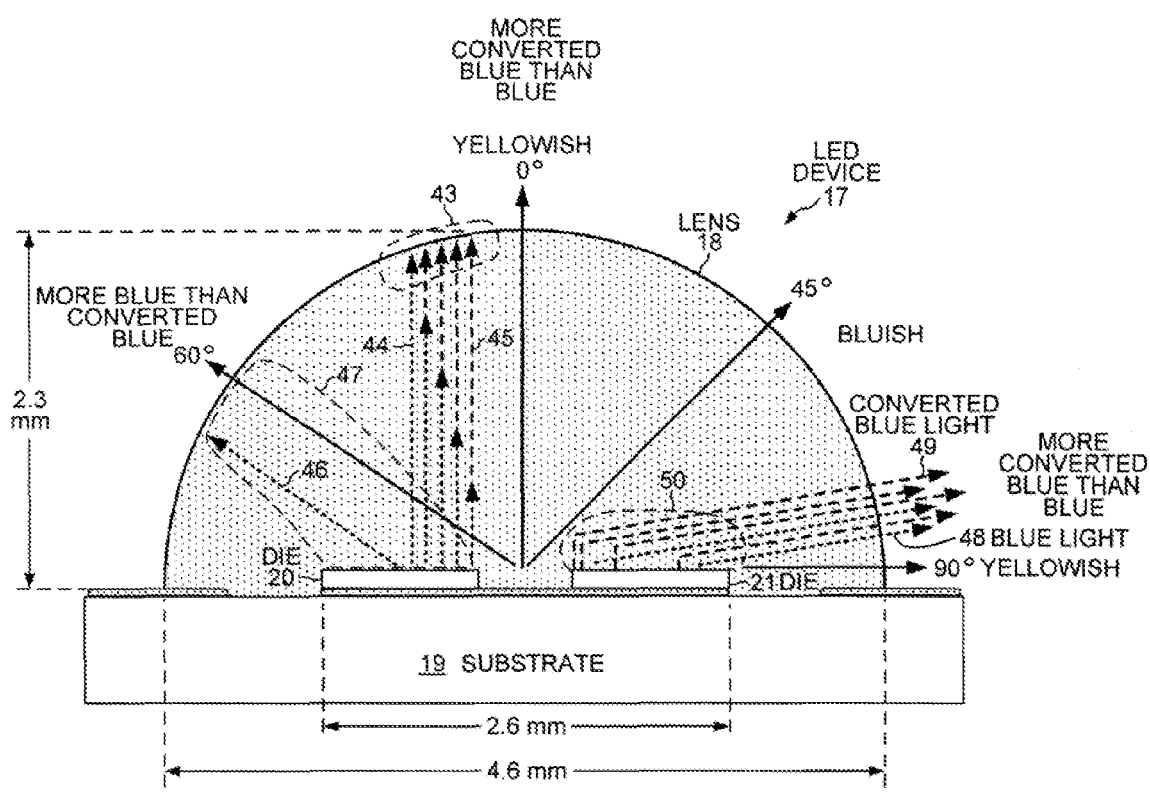
FIG. 3 is a cross-sectional view of an LED device that exhibits a somewhat improved angular color performance compared to the LED device of FIG. 1.
Figure 4:
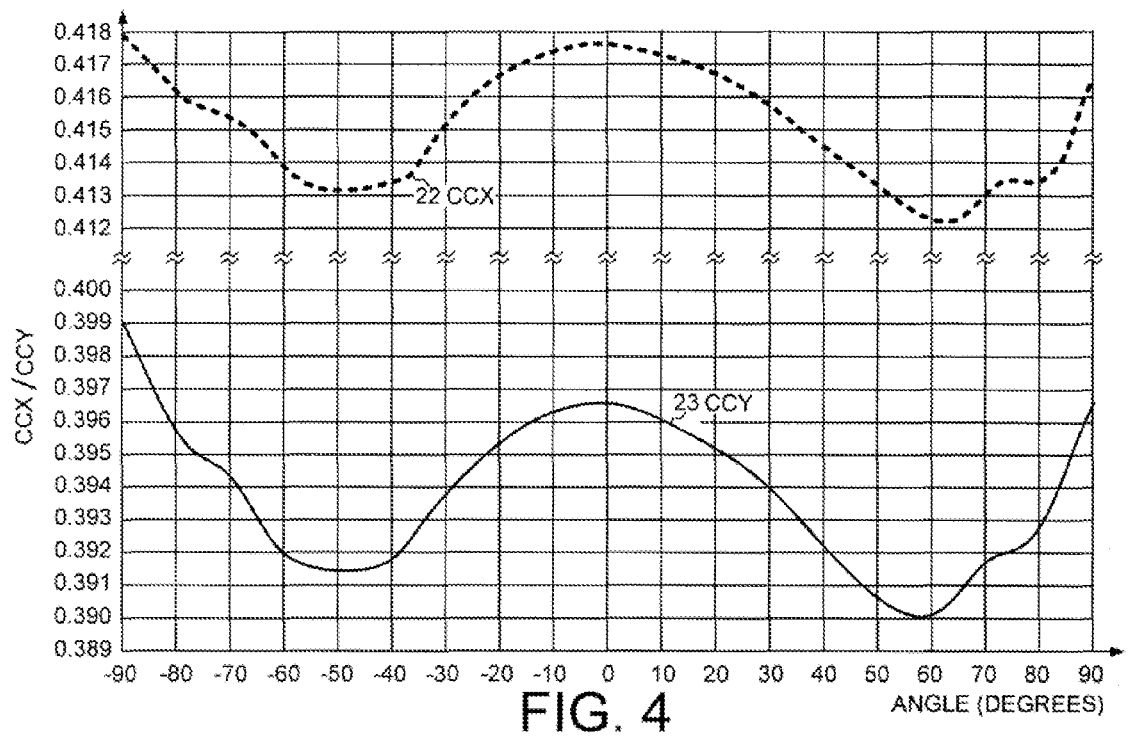
FIG. 4 is a graph of the color coordinates x and y over the emission angles −90° through 0° to 90° for the light emitted by the LED device of FIG. 3.

LED device 25 exhibits a much smaller variation than does LED device 17 in the color of the light emitted over the range of emission angles. The light emitted by LED device 25 at angles approaching ±90° does not include a sharply increasing component of yellow as does the light emitted by LED device 17. Moreover, LED device 25 has a much less pronounced bluish ring at about ±55° and a much fainter yellowish spot at 0°. FIG. 3 illustrates the three factors that cause LED device 17 to produce the yellowish ring towards ±90°, the bluish ring at about ±55°, and the yellowish spot at 0°. The effects of these factors are minimized by the design of lens 18 of LED device 25.

The factors that cause the non-uniformity in color-over-angle performance in LED device 17 are (i) the emission of blue light by a surface emitter combined with (ii) the emission of yellow light by a volumetric emitter (iii) in a configuration in which the blue light travels through different distances of a spherical volumetric emitter because the surface emitter is wider than a point source at the center of the sphere. All light emitted from a point source at the center of a spherical lens strikes the surface of the lens at a normal angle and has the highest probability of exiting the lens as opposed to being reflected internally according to Snell's law. Thus, a conventional lens in an LED device has the form of a hemisphere in order to maximize light extraction. However, the hemispherical shape is retained in LED device 17 despite the fact that the array of LEDs is not a point source. But so long as the diameter of the hemispherical lens is more than twice the surface emitter length across the LEDs, internal reflection is minimal because most of the light emitted from the surface emitter strikes the surface of the lens at nearly a normal angle and thus exits the lens. Nevertheless, most LED devices exceed this rough rule of thumb and cover more than half of the bottom chord length of the lens with surface emitting LEDs so as to use more of the available space beneath the lens and to generate more light per area occupied by the LED device. The consequence of trying to achieve a higher light output per area of the LED device is not only an increase in internal reflection of the light emitted towards the edges of the surface emitter but also an increase in the non-uniformity of the color of the light emitted over different angles.

The light emitted from LED dies 20-21 in FIG. 3 has an intensity that is proportional to the projected area of the top surface of the dies at the angle from which the emitted light is received. Thus, the blue light emitted from the LED dies has an intensity proportional to the cosine of the angle from which the emitted light is received. The maximum amount of blue light is emitted at a 0° angle, and the amount of blue light diminishes to zero at ±90°. On the other hand, yellow light is emitted equally in all directions by the phosphor particles that are struck by photons of blue light. However, the amount of phosphor particles in the various paths of the blue light varies and consequently generates differing amounts of yellow light. It is the relative amounts of blue light and yellow light that determine the color of the light that exits lens 18 as opposed to the absolute intensities of the blue and yellow light.

FIG. 3 illustrates that the light 43 exiting lens 18 around 0° at the top of the dome is yellowish because the blue light 44 emitted from the dies has traveled farther through the disbursed phosphor, and more of the blue light 44 has been converted to yellow light 45. Blue light 46 emitted from the outer edges of the LED dies 20-21, however, travels through a smaller volume 47 of disbursed phosphor and has a higher probability of exiting lens 18 without being converted to yellow light. Thus, a bluish ring is emitted at about ±55°. As the angle of the light exiting lens 18 becomes larger than 80°, however, the smaller component 48 of blue light emitted from the surface emitter at high angles becomes significantly overcompensated by the amount of converted blue light 49 emitted by phosphor particles in the volume 50 above each LED die that are struck by the greater amount of blue light emitted normal to the surface emitter. Thus, the light emitted towards ±90° is significantly more yellowish.

The design of lens 33 of novel LED device 25 is adapted to devices having a surface emitter of blue light and a volumetric emitter of longer wavelength light in which the surface emitter length is more than half of the bottom chord length of the volumetric emitting lens. LED device 25 sacrifices a higher internal reflection of light emitted towards high angles of the lens in exchange for a higher uniformity in the color of the light exiting the lens over all angles.

Figure 10:
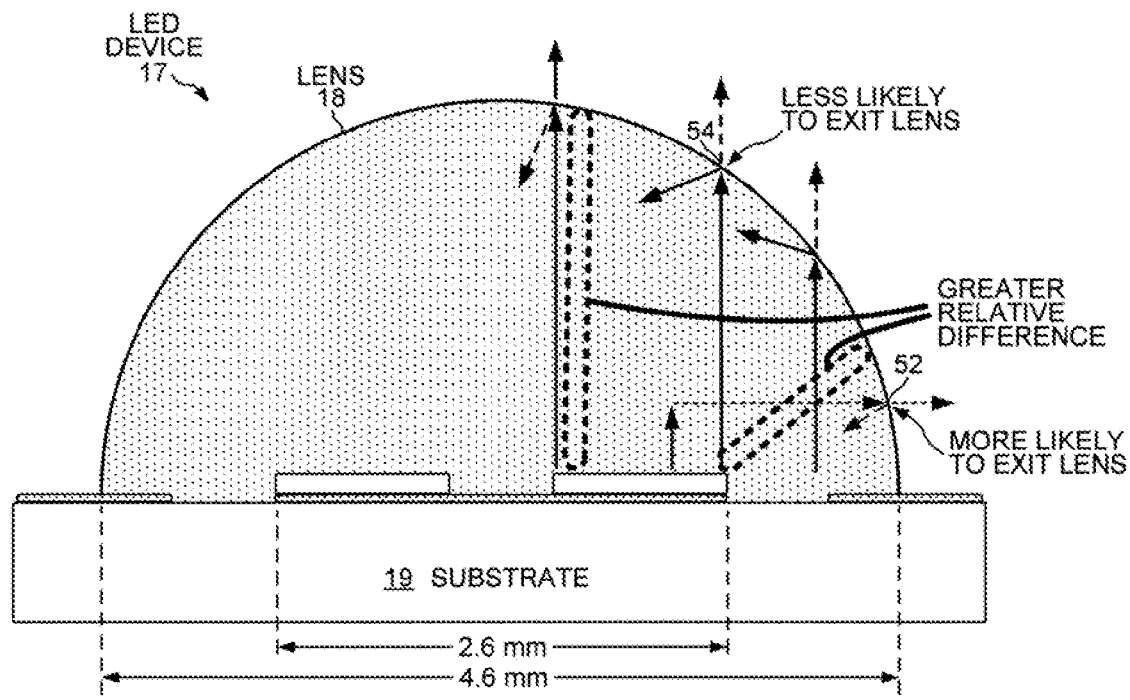
FIG. 10 is a cross-sectional view of the LED device of FIG. 3.
Figure 11:
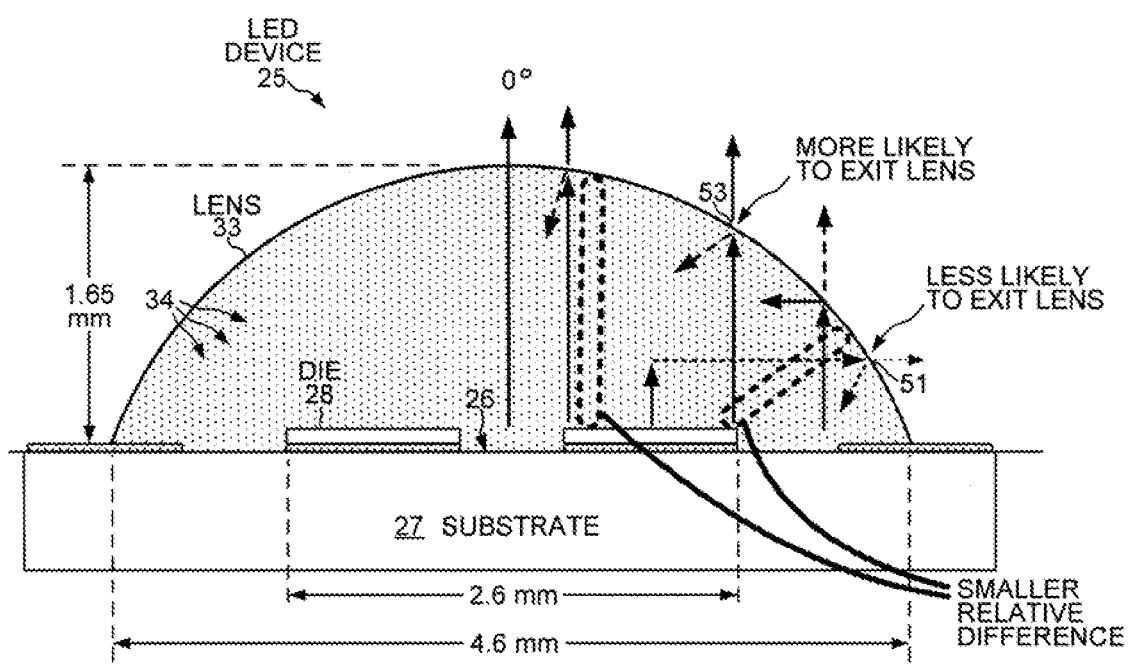
FIG. 11 is a cross-sectional view of the LED device of FIG. 6.

FIGS. 10-11 compare the internal reflectance of light emitted at various angles within lens 18 of LED device 17 and within lens 33 of LED device 25. As shown in FIGS. 10-11, light emitted from or near the LED dies of LED device 25 that is directed towards a high angle location 51 is less likely to exit lens 33 than is similarly emitted light likely to exit lens 18 at a high angle location 52. This is because the light strikes the surface of lens 18 at location 52 at a flatter angle than that at which the light strikes lens 33 at location 51. Conversely, light emitted from the edges of the surface emitter that is directed towards a lower angle location 53 is more likely to exit lens 33 than is similarly emitted light likely to exit lens 18 at a lower angle location 54. This is because the light strikes the surface of lens 33 at location 53 at a flatter angle than that at which the light strikes lens 18 at location 54.

Although most of the light exits lens 33 at the flatter angle at location 53, light extraction is not maximized by further flattening the curve of lens 33 because a small portion of the light is nevertheless reflected even at angles near normal. This small portion of reflected light is more likely to be absorbed by the surfaces of the LED dies as the surface of lens 33 comes closer to the LED dies and the light is less likely to be reflected onto the more reflective upper surface 26 of substrate 27. Typically, the top surface of the LED dies is about 80% reflective, whereas the upper surface 26 of substrate 27 is more than 90% reflective. By depositing a layer of highly reflective material between the LED dies, the surface above the substrate can be made more than 90% reflective. Thus, the shape of lens 33 is not flattened to significantly less than the top two thirds of a hemisphere in order not to overly increase the absorption of reflected light by the top surfaces of the LED dies and in order not to overly decrease the light extraction at high angles around the edges of the lens. In one embodiment, the layer of highly reflective material disposed over upper surface 26 does not extend under the LED dies 28-31 and does not extend over the LED dies, but rather contacts at least one edge of each of the LED dies.

When the highly reflective material is deposited by jetting, the material flows laterally and wets the side edges of the LED dies. The highly reflective material is deposited with such a thickness that once it has cured and solidified it has a reflectivity of at least ninety percent (for example, 94 percent). In one example, the highly reflective material is the material KER-2010-DAM or material KER-2020 that is commercially available from ShinEtsu Chemical Co. Ltd. of Tokyo, Japan. The highly reflective material may comprise silicone and a titanium dioxide powder, where the titanium dioxide powder is suspended in the silicone. The highly reflective material is made jettable by cutting it with a solvent. In one example, the solvent is an oil-based solvent such as dimethylformamide (DMF) commercially available from ShinEtsu as DMF0.65CS. The highly reflective material after being appropriately cut with the solvent has a viscosity of about 1000 centipois (cP) at room temperature.

FIGS. 10-11 also compare the relative distances that light emitted by the LED dies travels through the phosphor particles before exiting the lenses 18 and 33. Lens 18 exhibits a greater relative difference between the shortest distance from the surface emitter to the lens surface at around ±60° and the longest distance from the surface emitter to the lens surface at 0°. Because there is a smaller relative difference between the shortest distance from the surface emitter to the surface of lens 33 at around ±60° and the longest distance at 0°, the relative amounts of exiting blue and yellow light are more similar at ±60° and 0° in LED device 25.

Figure 12:
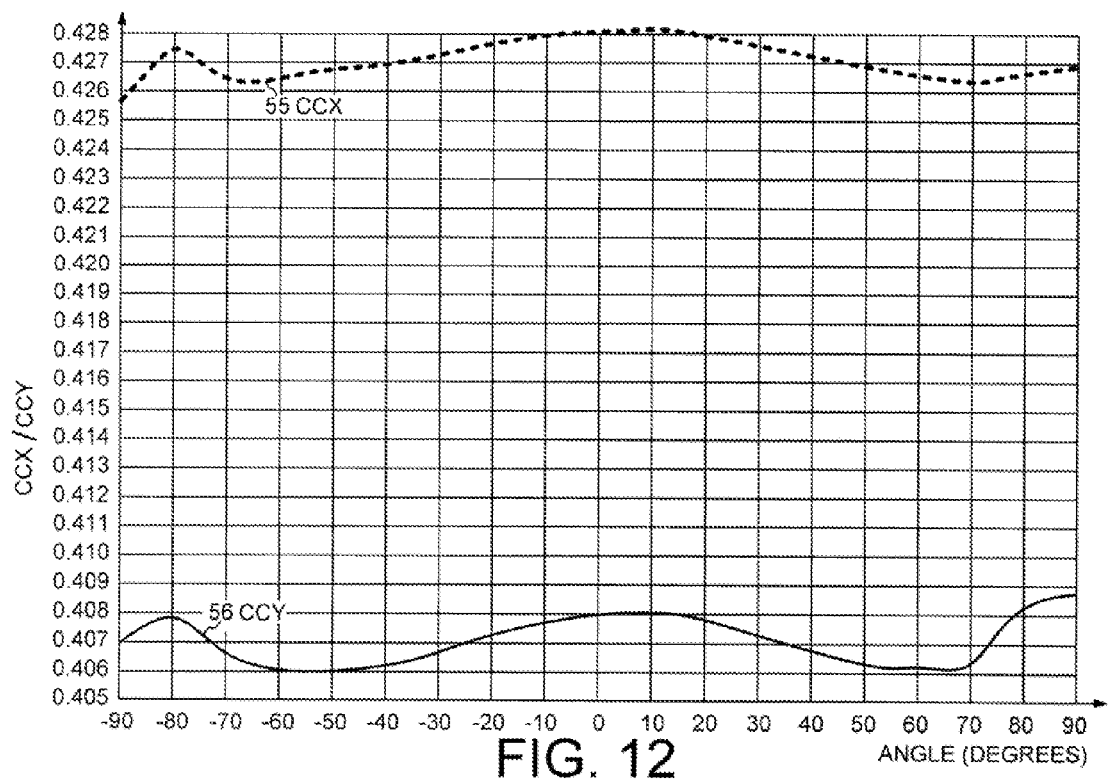
FIG. 12 is a graph of the color coordinates x and y over the emission angles −90° through 0° to 90° for the light emitted by the LED device of FIG. 6.

FIG. 12 is a graph showing the angular color performance of LED device 25 of FIG. 6. The graph shows how the color of the light emitted from lens 33 changes over the angle of the emitted light. The vertical axis indicates the values of both color coordinates x and y in the CIE XYZ color space. The dashed line 55 indicates how the color coordinate x (ccx) changes over the emission angles −90° through 0° to 90°, as those angles are shown in FIG. 6. The solid line 56 indicates how the color coordinate y (ccy) changes over the emission angles −90° through 0° to 90°. FIG. 12 shows that LED device 25 produces a much fainter bluish ring between angles ±50-65° than the bluish ring at about ±55° produced by LED device 17. More importantly, LED device 25 does not emit significantly more yellowish light as the angle of the light exiting lens 33 becomes larger than 80°. Thus, the faint bluish ring between angles ±50-65° is hardly perceptible to the human eye because the slight change toward greater blue is not contrasted by a change toward greater yellow at higher angles. The color performance indicated in FIG. 12 was generated with LED dies and phosphors that produce warm white light corresponding to about 3000° K. The variation in the color over the range of emission angles would be larger if less phosphor were used to produce cool white light, such as light corresponding to 5600° K.

Figure 5:
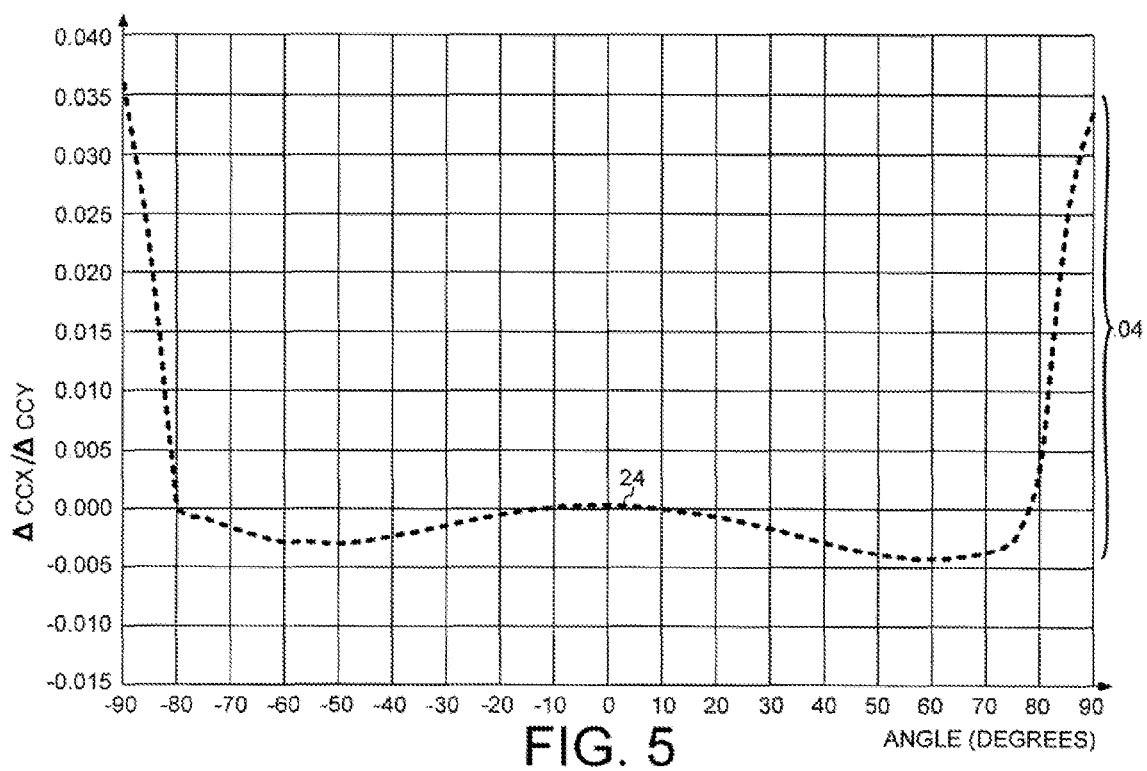
FIG. 5 is a graph of the change in the color coordinates x and y over the emission angles −90° through 0° to 90° for the light emitted by the LED device of FIG. 3.
Figure 13:
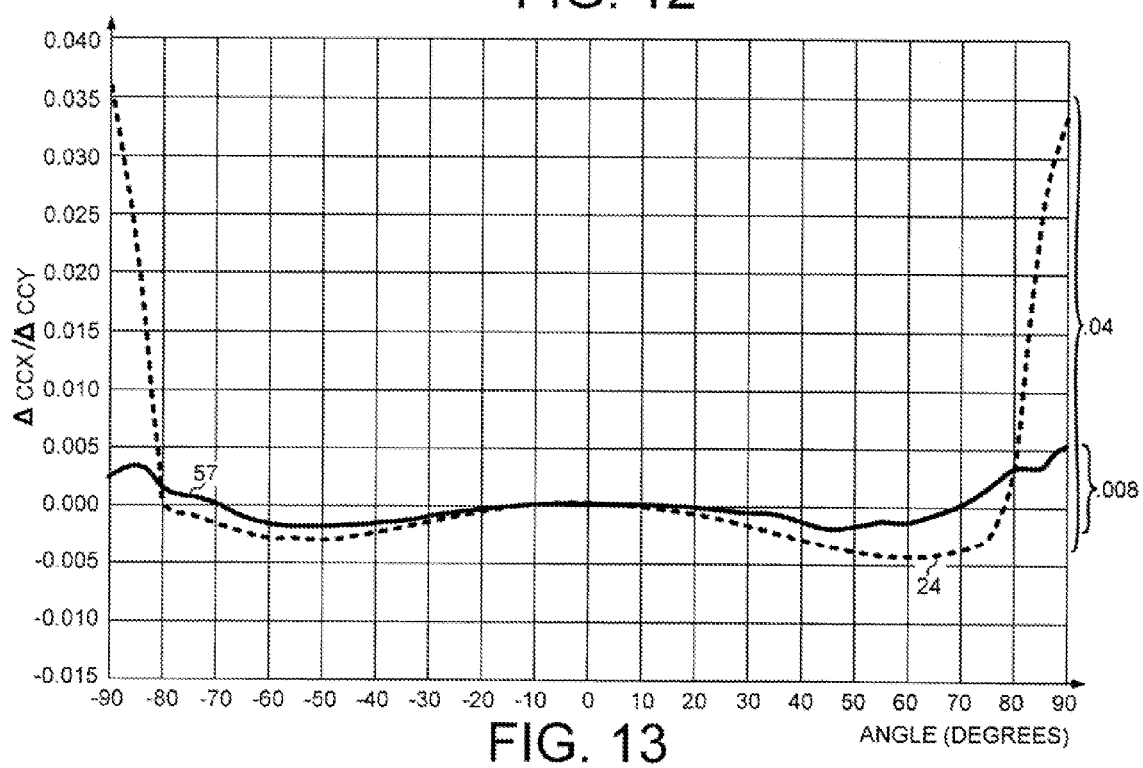
FIG. 13 is a graph of the change in the color coordinates x and y over the emission angles −90° through 0° to 90° for the light emitted by the LED device of FIG. 6.

FIG. 13 shows the change in values of the color coordinates x and y indicated in FIG. 12. The change in the values of the color coordinate x over the range of emission angles is similar to the change in the values of the color coordinate y, so solid line 57 represents the approximate change in each of the color coordinates x and y over the emission angles −90° to 90°. The values of the color coordinates x and y vary by only 0.008 over the entire angular emission range. Dashed line 24 from FIG. 5 is included in FIG. 12 to show the great improvement in color uniformity of LED device 25 compared to LED device 17. Not only is the color variation of the light emitted by LED device 25 five times smaller than for LED device 17, but the color variation is also less perceptible to the human eye because the emitted light that becomes slightly more bluish as the emission angle increases from 0° to about ±50° does not then revert to becoming significantly more yellowish at emission angles greater than ±80° as is the case for LED device 17.

Flattening the lens of LED device 25 to have the shape of significantly less than the top two thirds of a hemisphere did not significantly increase the color-over-angle uniformity of the emitted light. Thus, the small improvement in the angular color performance of a flatter lens is outweighed by the greater absorption caused by the flatter and shallower lens internally reflecting light directly back to the top surfaces of the LED dies, which absorb more of the internally reflected light than do the other surfaces around the LED dies.

Figure 14:
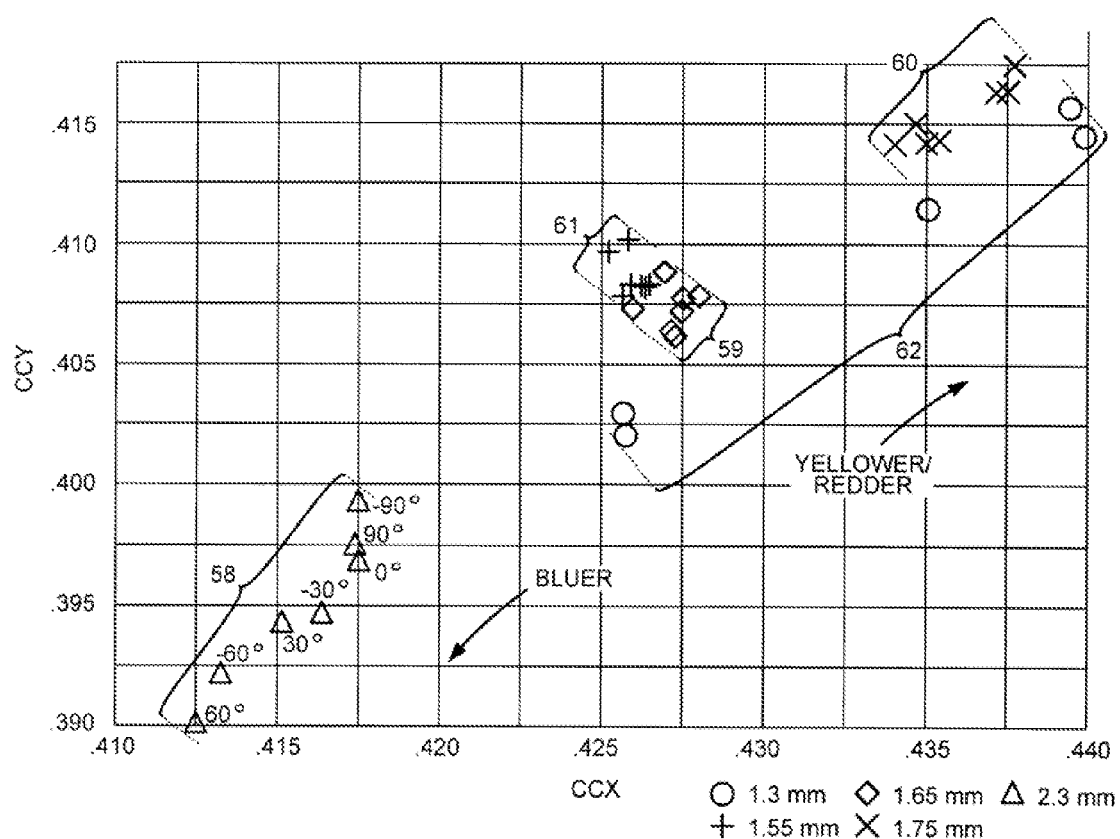
FIG. 14 is a plot of the color coordinates x and y showing the distribution of colors emitted at various angles by different lens designs, including the lenses of the LED devices of FIGS. 3 and 6.

FIG. 14 is a plot of the distribution of colors emitted at various angles from different lens designs. The relative dispersion of the points corresponding to each lens indicates the amount of color-over-angle uniformity. More tightly grouped points indicate greater color uniformity. The triangles 58 plot the ccx and ccy coordinates of the colors emitted from lens 18 of LED device 17 at the seven angles 0°, ±30°, ±60° and ±90°. Lens 18 has a 2.3 mm dome height over a 4.6 mm bottom chord length. The diamonds 59 plot the ccx and ccy coordinates of the colors emitted from lens 33 of LED device 25 at the same seven angles. Lens 33 has a 1.65 mm dome height over a 4.6 mm bottom chord length. Thus, the radius of the surface of lens 33 is 2.475 mm, and lens 33 has the shape of the top 66% of a hemisphere. The greater spacing between the triangles 58 than between the diamonds 59 indicates that the color-over-angle uniformity of lens 33 is greater than that of lens 18. For example, the maximum change in the ccx coordinates corresponding to the diamonds 59 over all of the seven angles 0°, ±30°, ±60° and ±90° is less than 0.004.

The x's 60 plot the ccx and ccy coordinates of the colors emitted from a lens with a 1.75 mm dome height over a 4.6 mm bottom chord length. The surface of such a lens has a radius of 2.386 mm, and the shape of the lens is the top 73.3% of a hemisphere. The spacing between the x's 60 compared to the spacing between the diamonds 59 indicates that there is a significant improvement in the angular color performance by lowering the dome height from 1.75 mm to 1.65 mm.

The +'s 61 plot the ccx and ccy coordinates of the colors emitted from a lens with a 1.55 mm dome height over a 4.6 mm bottom chord length. The surface of such a lens has a radius of 2.748 mm, and the shape of the lens is the top 56.4% of a hemisphere. The spacing between the +'s 61 compared to the spacing between the diamonds 59 indicates that there is little improvement in the angular color performance by lowering the dome height from 1.65 mm to 1.55 mm. Thus, the small improvement in the angular color performance achieved by reducing the dome height from 1.65 mm to 1.55 mm is outweighed by the greater absorption caused by the flatter lens that is closer to the LED dies and that causes greater internally reflectance of light directly back to the absorptive top surfaces of the LED dies.

FIG. 14 also plots the distribution of colors emitted at various angles from a lens that is not shaped as a portion of a sphere. The circles 62 plot the ccx and ccy coordinates of the colors emitted at five different angles from a lens with a flat surface that is 1.3 mm above the upper surface 26 of substrate 27 and that has rounded edges 63 as shown in FIG. 6. The cross section of the lens surface more closely resembles a parabolic curve than a circular curve. The circles 62 are much more widely space than are the diamonds 59, the +'s 61, the x's 60 or even the triangles 58. Although the shape of the lens with the 1.3 mm height has a smaller relative difference between the distance from the edge of the surface emitter to the lens surface at around ±60° and the distance from the surface emitter to the lens top at 0°, which should diminish any bluish ring at around ±60°, the angular color performance of the quasi-parabolic lens is much less uniform than that of lenses shaped as portions of a sphere.

Figure 15:
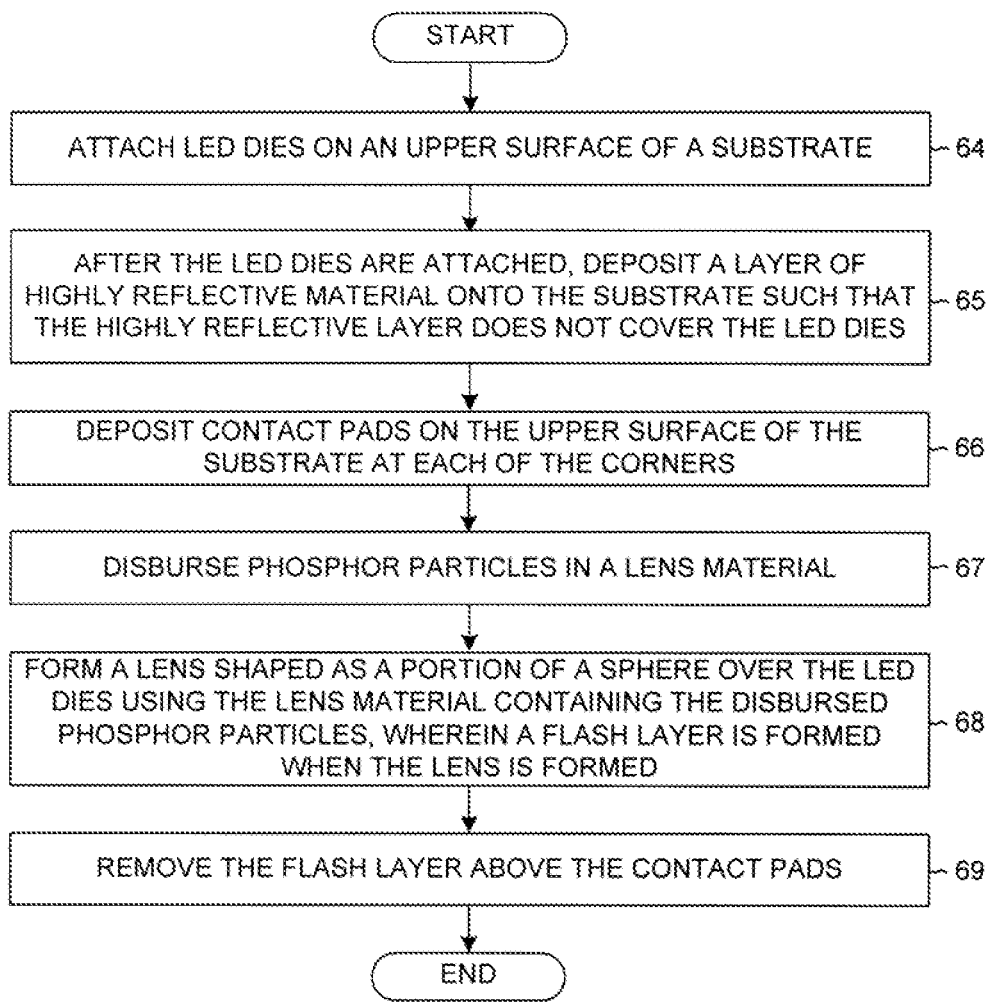
FIG. 15 is a flowchart of steps of a method for forming a lens for LED dies that results in greater uniformity of the color of the emitted light.

FIG. 15 is a flowchart illustrating steps 64-69 of a method of forming a lens that results in greater uniformity of the color of the emitted light. In a first step 64, LED dies are attached to an upper surface of a substrate. The maximum distance between the farthest apart edges of the LED dies is the surface emitter length. In step 65, after the LED dies are attached to the substrate, a layer of highly reflective material is deposited onto the substrate such that the layer does not cover the LED dies but is disposed between the dies. In step 66, a contact pad is deposited on the upper surface at each of the corners of the substrate. In step 67, phosphor particles are disbursed in a lens material, such as silicone or epoxy. The phosphor particles can be made of YAG or TAG.

In step 68, a lens is formed over the LED dies using the lens material containing the disbursed phosphor particles. The lens is shaped as a portion of a sphere. The dome height of the lens extends from the top of the dome to the upper surface of the substrate. The bottom chord length of the lens is the maximum length that the lens material extends over the upper surface of the substrate. The bottom chord length is less than twice the surface emitter length of the combined LED dies. The dome height of the lens is between 57% and 73% of the radius of the sphere of which the lens is a portion.

The lens formed in step 68 is a means for reducing the non-uniformity over all emission angles in the color of the combined bluish light emitted by the LED dies and the yellowish light emitted by the phosphor particles. The lens reduces the non-uniformity in the color of the combined emitted bluish and yellowish light such that the CIE color coordinate x of the color does not change more than 0.004 over all angles relative to the upper surface of the substrate.

Each of the contact pads is laterally outside of the lens. Forming the lens also forms a flash layer over the upper surface of the substrate. The flash layer of lens material is about 50 microns thick. In step 69, the flash layer is removed from above the contact pads.

Although certain specific embodiments are described above for instructional purposes, the teachings of this patent document have general applicability and are not limited to the specific embodiments described above. Although the novel lens is described above as being molded over an array of LED dies, the angular color performance of an LED device is also significantly improved where the novel lens is molded over a single LED die whose surface emitter length is more than half of the bottom chord length of the lens. Accordingly, various modifications, adaptations, and combinations of various features of the described embodiments can be practiced without departing from the scope of the invention as set forth in the claims.

What is claimed is:

1. An apparatus, comprising:
   a substrate with an upper surface;
   light emitting diode (LED) dies disposed on the upper surface of the substrate, wherein a surface emitter length is a maximum distance between farthest apart edges of the LED dies;
   a lens material disposed on the upper surface of the substrate over the LED dies, wherein the lens material is shaped as a domed portion of a hemisphere, and wherein the domed portion is greater than one half of the hemisphere and less than five sixths of the hemisphere; and
   phosphor particles disbursed throughout the lens material, wherein the domed portion has a bottom that extends over the upper surface of the substrate by a chord length, and therein the chord length is less than twice the surface emitter length.

2. The apparatus of claim 1, wherein the upper surface of the substrate is more reflective than are the LED dies.

3. The apparatus of claim 1, wherein the upper surface of the substrate is more than 90% reflective.

4. The apparatus of claim 1, wherein the lens material is silicone.

5. The apparatus of claim 1, wherein the LED dies are arranged in a square matrix of LED dies.

6. The apparatus of claim 1, wherein the lens material is molded over the LED dies.

7. The apparatus of claim 1, further comprising:
   a layer of highly reflective material disposed over the upper surface of the substrate, wherein the layer does not extend under the LED dies and does not extend over the LED dies, and wherein the layer contacts at least one edge of each of the LED dies.

8. The apparatus of claim 1, wherein the lens material is compression molded to form the domed portion together with a flash layer over the upper surface of the substrate.

9. The apparatus of claim 8, further comprising:
   contact pads disposed on the upper surface of the substrate, wherein the contact pads are outside of the domed portion, and wherein the domed portion and the flash layer are disposed over substantially all of the upper surface of the substrate except for over the contact pads.

10. A method, comprising:

attaching light emitting diode (LED) dies on an upper surface of a substrate, wherein a surface emitter length is a maximum distance between farthest apart edges of the LED dies;

disbursing phosphor particles in a lens material; and forming a lens over the LED dies using the lens material containing the disbursed phosphor particles, wherein the lens is shaped as a domed portion of a hemisphere, wherein the domed portion is greater than one half of the hemisphere and less than five sixths of the hemisphere, wherein the domed portion has a bottom that extends over the upper surface of the substrate by a chord length, and therein the chord length is less than twice the surface emitter length.

11. The method of claim 10, wherein the forming the lens is performed using compression molding.

12. The method of claim 10, wherein the lens material is compression molded to form the lens together with a flash layer over the upper surface of the substrate.

13. The method of claim 10, wherein the upper surface of the substrate is more reflective than are the LED dies.

14. The method of claim 10, wherein the lens material is silicone.

15. The method of claim 10, wherein the LED dies are arranged in a square matrix of LED dies.

16. The method of claim 10, further comprising:

depositing a layer of highly reflective material onto the substrate such that the layer does not cover the LED dies, wherein the depositing occurs after the attaching the LED dies.

17. The method of claim 16, wherein the layer of highly reflective material is deposited onto the substrate such that the layer contacts at least one edge of each of the LED dies.

18. The method of claim 10, further comprising:

jetting a layer of highly reflective material onto the substrate such that the highly reflective material flows laterally and wets at least one edge of each of the LED dies.

19. The method of claim 10, further comprising:

depositing a contact pad on the upper surface of the substrate, wherein the contact pad is laterally outside of the lens, and wherein the forming the lens also forms a flash layer over the upper surface of the substrate; and removing the flash layer from above the contact pad.

20. An apparatus, comprising:

a substrate with an upper surface;

a light emitting diode (LED) die disposed on the upper surface of the substrate, wherein a surface emitter length is a maximum distance between farthest apart edges of the LED die;

a lens material disposed on the upper surface of the substrate over the LED die, wherein the lens material is shaped as a domed portion of a hemisphere, and wherein the domed portion is greater than one half of the hemisphere and less than five sixths of the hemisphere; and phosphor particles disbursed throughout the lens material, wherein the domed portion has a bottom that extends over the upper surface of the substrate by a chord length, and therein the chord length is less than twice the surface emitter length.

* * * * *